(12) United States Patent
Endo et al.

(10) Patent No.: US 9,762,006 B2
(45) Date of Patent: Sep. 12, 2017

(54) ELECTRIC CONNECTOR WITH A STRUCTURE TO PREVENT INSERT-MOLDING FROM HINDERING CONTACT AND METHOD OF FABRICATING THE SAME

(71) Applicant: DAI-ICHI SEIKO CO., LTD., Kyoto (JP)

(72) Inventors: Takayoshi Endo, Shizuoka (JP); Shuji Touno, Shizuoka (JP)

(73) Assignee: DAI-ICHI SEIKO CO., LTD. (JP)

( * ) Notice: Subject to any disclaimer, the term of this patent is extended or adjusted under 35 U.S.C. 154(b) by 0 days.

(21) Appl. No.: 14/933,715

(22) Filed: Nov. 5, 2015

(65) Prior Publication Data
US 2016/0134066 A1 May 12, 2016

(30) Foreign Application Priority Data

Nov. 12, 2014 (JP) .................................. 2014-230098

(51) Int. Cl.
*H01R 24/38* (2011.01)
*H01R 9/05* (2006.01)
(Continued)

(52) U.S. Cl.
CPC ............... *H01R 24/38* (2013.01); *H01R 9/05* (2013.01); *H01R 43/16* (2013.01); *H01R 43/24* (2013.01);
(Continued)

(58) Field of Classification Search
CPC ............................ H01R 24/38; H01R 13/405; B29C 45/14639; B29C 70/72; H01L 21/56
(Continued)

(56) References Cited

U.S. PATENT DOCUMENTS

| 4,824,380 A | 4/1989 | Matthews ...................... 439/176 |
| 5,271,740 A | 12/1993 | Endo et al. .................... 439/637 |

(Continued)

FOREIGN PATENT DOCUMENTS

| EP | 0 765 010 | 3/1997 | ............. H01R 23/72 |
| JP | 61-156187 | 9/1986 | ............ H01R 13/629 |

(Continued)

OTHER PUBLICATIONS

German Official Action issued in related German Patent Application Serial No. 10 2015 221 828.7 dated Jun. 29, 2016 with English translation (9 pages).

(Continued)

*Primary Examiner* — Abdullah Riyami
*Assistant Examiner* — Justin Kratt
(74) *Attorney, Agent, or Firm* — Hayes Soloway P.C.

(57) ABSTRACT

The electric connector includes a housing to be fit into a second electric connector, and a cylindrical hollow terminal making contact with a projecting terminal arranged in the second electric connector when the projecting terminal is inserted into the cylindrical hollow terminal, the housing and the cylindrical hollow terminal being formed integrally with each other by an insertion-molding process, the cylindrical hollow terminal being formed with a structure for preventing molten resin from flowing into an area at which the cylindrical hollow terminal and the projecting terminal make contact with each other while the inserting-molding process is being carried out.

10 Claims, 14 Drawing Sheets

(51) Int. Cl.
  *H01R 43/16*      (2006.01)
  *H01R 43/24*      (2006.01)
  *B29C 45/14*          (2006.01)
  *H01L 21/56*          (2006.01)
  *H01R 13/405*         (2006.01)
  *B29C 70/72*          (2006.01)
  *H01R 101/00*         (2006.01)
  *H01R 13/05*          (2006.01)
  *H01R 13/53*          (2006.01)

(52) U.S. Cl.
  CPC ........ *B29C 45/14639* (2013.01); *B29C 70/72* (2013.01); *H01L 21/56* (2013.01); *H01R 13/052* (2013.01); *H01R 13/405* (2013.01); *H01R 13/53* (2013.01); *H01R 2101/00* (2013.01)

(58) Field of Classification Search
  USPC .................................................. 439/578, 736
  See application file for complete search history.

(56) References Cited

U.S. PATENT DOCUMENTS

| | | | |
|---|---|---|---|
| 5,823,824 A * | 10/1998 | Mitamura et al. | H01R 13/50 439/585 |
| 5,932,841 A | 8/1999 | Matsumoto et al. | 174/35 |
| 6,186,837 B1 | 2/2001 | Abe | 439/748 |
| 6,203,372 B1 | 3/2001 | Matsumoto et al. | 439/607 |
| 7,766,682 B1 | 8/2010 | Larkin | 439/281 |
| 2002/0009918 A1 | 1/2002 | Banas et al. | 439/404 |
| 2005/0009390 A1 | 1/2005 | Barker et al. | 439/188 |
| 2005/0173395 A1 | 8/2005 | Haussner et al. | 219/270 |
| 2016/0134066 A1 | 5/2016 | Endo et al. | 439/578 |

FOREIGN PATENT DOCUMENTS

| | | | |
|---|---|---|---|
| JP | 04-028180 | 1/1992 | ............. H01R 13/50 |
| JP | 06-41082 | 5/1994 | ............. H01R 17/04 |
| JP | H07037265 | 8/1995 | ............. H01R 17/04 |
| JP | 7-245153 | 9/1995 | ........... H01R 13/648 |
| JP | 8-241763 | 9/1996 | ........... H01R 13/648 |
| JP | H0935825 | 2/1997 | ............. H01R 23/26 |
| JP | H113739 | 1/1999 | ........... H01R 13/428 |
| JP | 2598581 | 6/1999 | ............. H01R 13/05 |
| JP | 2002075558 | 3/2002 | ............. H01R 13/04 |
| JP | 2002-373729 | 12/2002 | ............. H01R 13/44 |
| JP | 2005085649 | 3/2005 | ............. H01R 13/11 |
| JP | 2005-207730 | 8/2005 | ................ F23Q 7/00 |
| JP | 2007521181 | 8/2007 | ............. B60R 21/26 |
| JP | 2011216439 | 10/2011 | ............. H01R 24/00 |
| JP | 2012-129103 | 7/2012 | ............. H01R 24/38 |
| JP | 2014164918 | 9/2014 | ........... H01R 43/048 |

OTHER PUBLICATIONS

Japanese Official Action issued in related Japanese Patent Application Serial No. 2014-252497, dated Mar. 29, 2016, with English translation (6 pages).

Korean Office Action (with translation) issued in application No. 10-2015-0154307, dated Sep. 7, 2016 (9 pgs).

\* cited by examiner

ELECTRIC CONNECTOR WITH A STRUCTURE TO PREVENT INSERT-MOLDING FROM HINDERING CONTACT AND METHOD OF FABRICATING THE SAME

BACKGROUND OF THE INVENTION

Field of the Invention

The invention relates to an electric connector including a housing to be fit into a mating electric connector, and a cylindrical hollow terminal making contact with a projecting terminal arranged in the mating electric connector when the projecting terminal is inserted into the cylindrical hollow terminal. The invention further relates to a method of fabricating the electric connector.

Description of the Related Art

There is known an electric connector including a cylindrical connector. The electric connector makes an electrical connection with a mating electric connector including a projecting terminal when the projecting terminal is fit into the cylindrical connector of the electric connector.

Even if the electric connector and the mating electric connector are fit into each other with the electric connector or the mating electric connecter is in rotation around an axis thereof, it is possible to cause an outer surface of the projecting terminal and an inner surface of the cylindrical terminal to make contact with each other.

Since the electric connector and the mating electric connector can be fit into each other even if they are in rotation around an axis thereof in any direction, it is possible to cause them to manually fit into each other in invisible condition.

The above-mentioned electric connector is used in a glow plug acting as a spark plug or a preheating plug in an engine, or is used as a connector for connecting a combustion pressure sensor to a wire harness.

FIG. 18 is a cross-section view of a glow plug connector suggested in Japanese Patent Application Publication No. 2005-207730.

The illustrated glow plug connector includes a connector casing 1001 and a fitting 1002. The connector casing 1001 includes sensor contact terminals 1011 to 1013 arranged on an inner wall of the connector casing 1001. The fitting 1002 includes a hollow tube 1003 extending coaxially with and centrally longitudinally of the fitting 1002. Contact terminals 1014 to 1016 are arranged on an outer wall of the tube 1003. The contact terminals 1014 to 1016 make contact with the sensor contact terminals 1011 to 1013, respectively, when the connector casing 1001 is fit into the fitting 1002. Within the tube 1003 is arranged a current contact 1006 which makes contact with a current contact 1005 of the connector casing 1001 when the connector casing 1001 is fit into the fitting 1002.

There is known a coaxial connector including a first electric connector having a projecting terminal, and a mating electric connector having a cylindrical connector. The first and second connectors can be fit into each other only in a predetermined direction.

FIG. 19 is a cross-sectional view of the coaxial connector suggested in Japanese Patent Application Publication No. 2012-129103.

The illustrated coaxial connector includes a female connector 1110 and a male connector 1120.

The female connector 1110 includes a female housing 1110H, a female outer terminal 1110To housed in the female housing 1110H, a female inner terminal 1110Ti arranged in the female outer terminal 1110To, and a dielectric 1110D arranged between the female outer terminal 1110To and the female inner terminal 1110Ti.

The male connector 1120 includes a male housing 1120H, a male outer terminal 1120To housed in the male housing 1120H, and a male inner terminal 1120Ti arranged in the male outer terminal 1120To.

In the coaxial connector illustrated in FIG. 19, the female housing 1110H and the dielectric 1110D are formed integral with each other, and an entirely circumferential shield for an area at which the female inner terminal 1110Ti and the male inner terminal 1120Ti make contact with other is defined by a half-cylinder of the male outer terminal 1120To and a half-cylinder of the female outer terminal 1110To.

In the coaxial connector illustrated in FIG. 19, the female inner terminal 1110Ti (a cylindrical terminal) is coaxially surrounded by the dielectric 1110D formed integrally with the female housing 1110H. Thus, the female inner terminal 1110Ti is firmly supported at an outer surface thereof by the dielectric 1110D.

In a process of integrally forming a cylindrical terminal and a housing, a cylindrical terminal is put into a cavity of a die, and then, molten resin for forming a housing is poured into the cavity. Thus, the resultant housing has the same shape as that of the cavity. When the housing is formed, it is necessary to insert a projecting terminal into the cylindrical terminal to ensure a space in an inner space of the cylindrical terminal. The space means a space in which the projecting terminal makes contact with an inner surface of the cylindrical terminal.

The above-identified Japanese Patent Application Publications are silent about steps of forming a housing. For instance, if steps of arranging a cylindrical terminal in a cavity of a die and pouring molten resin into the cavity were merely carried out, the molten resin would flow into an inner space of the cylindrical terminal, and thus, it would not be possible to ensure a space in which the projecting terminal makes contact with the cylindrical terminal.

SUMMARY OF THE INVENTION

In view of the above-mentioned problems in the conventional electric connectors, it is an object of the present invention to provide an electric connector capable of ensuring, in a process of forming a housing, a space in which a projecting terminal makes contact with a cylindrical terminal to thereby make it possible to form a cylindrical terminal and a housing integrally with each other by an insertion-molding process.

It is also an object of the present invention to provide a method of fabricating the above-mentioned electric connector.

In one aspect of the present invention, there is provided an electric connector including a housing to be fit into a mating electric connector, and a cylindrical hollow terminal making contact with a projecting terminal arranged in the mating electric connector when the projecting terminal is inserted into the cylindrical hollow terminal, the housing and the cylindrical hollow terminal being formed integrally with each other by an insertion-molding process, the cylindrical hollow terminal being formed with a structure for preventing molten resin from flowing into an area at which the cylindrical hollow terminal and the projecting terminal make contact with each other while the inserting-molding process is being carried out.

The electric connector in accordance with the present invention is designed to include a structure for preventing molten resin from flowing into an area at which the cylindrical hollow terminal and the projecting terminal make contact with each other while the inserting-molding process is being carried out. Thus, it is possible to ensure a space in which the projecting terminal makes contact with the cylindrical terminal while the housing is being formed.

It is preferable that the structure is comprised of a projection projecting from an inner wall toward an inner space of the cylindrical hollow terminal. For instance, the projection is formed annularly.

In an insertion-molding process of forming the housing and the cylindrical terminal integrally with each other, a die in the form of a bar is inserted into the cylindrical terminal into which the projecting terminal has been already inserted, through a distal end of the cylindrical terminal to thereby make contact with the projection acting as the resin-flowing prevention structure. As a result, a clearance between the bar-shaped die and the projection is closed. Thus, an area at which the cylindrical hollow terminal and the projecting terminal make contact with each other while the inserting-molding process is being carried out can be closed.

It is preferable that the cylindrical hollow terminal is formed on an outer wall thereof with a recess at the same location of the projection.

Molten resin of which a housing is formed can be introduced into the recess, ensuring that the resin in the recess prevents the cylindrical terminal from being pulled out. Furthermore, since the recess can be formed by pressing an outer surface of the cylindrical terminal when the projection is formed in the cylindrical terminal, it is possible to form in a single step both the projection on an inner wall and the recess at an outer wall of the cylindrical terminal.

It is preferable that a plurality of the projections are formed in a length-wise direction of the cylindrical hollow terminal.

Since a die in the form of a bar makes contact with the cylindrical terminal at a plurality of sites, even if molten resin passes through the first projection, the second projection can stop the molten resin. Accordingly, it is surely possible to prevent molten resin from flowing into an area at which the cylindrical hollow terminal and the projecting terminal make contact with each other while the inserting-molding process is being carried out, to thereby ensure a space in which the projecting terminal is inserted into the cylindrical terminal.

It is preferable that the cylindrical hollow terminal is formed at a circumferential wall thereof with at least one through-hole between a proximal end of the cylindrical hollow terminal and the projection, in which case, the through-hole can be filled with resin.

It is preferable that the structure is comprised of a closed section comprising a closed proximal end of the cylindrical hollow terminal, the closed section having a thickness smaller than a diameter of the cylindrical hollow terminal and a width greater than a diameter of the cylindrical hollow terminal.

Since the cylindrical terminal is closed at a distal end thereof by means of the closed section when the housing and the cylindrical terminal are formed integrally with each other by an insertion-molding process, it is possible to close an area at which the cylindrical hollow terminal and the projecting terminal make contact with each other.

It is preferable that the closed section is formed by a pressing process.

The cylindrical terminal can be readily closed at a distal end thereof by a pressing process.

It is preferable that the housing is comprised of an inner housing to be fit into a first space formed in an outer housing of the mating electric connector, the inner housing being formed with a second space into which a first shaft arranged in the first space is fit, and a second shaft arranged in the second space and guided into a guide hole formed in the first shaft, the cylindrical hollow terminal being formed as a part of the second shaft.

A housing of the mating electric connector is comprised of an outer housing, and a housing of the electric connector in accordance with the present invention is comprised of an inner housing to be fit into the first space formed in the outer housing. The inner housing is formed with the second space and the second shaft. Accordingly, when the outer and inner housings are fit into each other, the inner housing is fit into the first space of the outer housing, and the second shaft formed in the second space of the inner housing is inserted into the guide hole. The cylindrical terminal as a part of the second shaft is inserted into the guide hole to thereby make contact with the projecting terminal arranged in the guide hole.

It is preferable that at least one first contact terminal is formed on an outer surface of the first shaft, and at least one second contact terminal each making contact with the first contact terminal is formed on an inner surface of the second space.

When the outer and inner housings are fit into each other, the first and second contact terminals make contact with each other, as well as the cylindrical terminal makes contact with the projecting terminal.

In another aspect of the present invention, there is provided a method of fabricating an electric connector, including inserting a bar into a cylindrical hollow terminal to thereby cause the bar to make contact with a later-mentioned projection, the cylindrical hollow terminal making contact with a projecting terminal arranged in a mating electric connector when the projecting terminal is inserted into the cylindrical hollow terminal, and including an annular projection projecting from an inner wall toward an inner space of the cylindrical hollow terminal, the cylindrical hollow terminal preventing molten resin for an insertion-molding process from flowing into an area at which the cylindrical hollow terminal and the projecting terminal make contact with each other while the inserting-molding process is being carried out, and carrying out an insertion-molding process to form a housing to be fit into the mating electric connector and the cylindrical hollow terminal integrally with each other.

The above-mentioned electric connector can be fabricated in accordance with the method.

In still another aspect of the present invention, there is provided a method of fabricating an electric connector, including preparing a cylindrical hollow terminal making contact with a projecting terminal arranged in a mating electric connector when the projecting terminal is inserted into the cylindrical hollow terminal, and having a closed section comprising a closed proximal end opposite to a distal end into which the projecting terminal is inserted, and carrying out an insertion-molding process to form a housing to be fit into the mating electric connector and the cylindrical hollow terminal integrally with each other.

The above-mentioned electric connector can be fabricated in accordance with the method.

The advantages obtained by the aforementioned present invention will be described hereinbelow.

The electric connector in accordance with the present invention is able to prevent molten resin for the insertion-molding process from flowing into an area at which the cylindrical hollow terminal and the projecting terminal make contact with each other while the inserting-molding process is being carried out. Thus, it is possible to ensure a space in which the projecting terminal is inserted into the cylindrical terminal while the housing is being formed. Thus, the present invention makes it possible to form the cylindrical terminal and the housing integrally with each other by an insertion-molding process.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

An electric connector in accordance with a first embodiment of the present invention is explained hereinbelow with reference to drawings.

In the specification, a wording "front" means a side through which the two electric connectors are fit into each other, and a wording "rear" means the opposite side.

Figure 1:
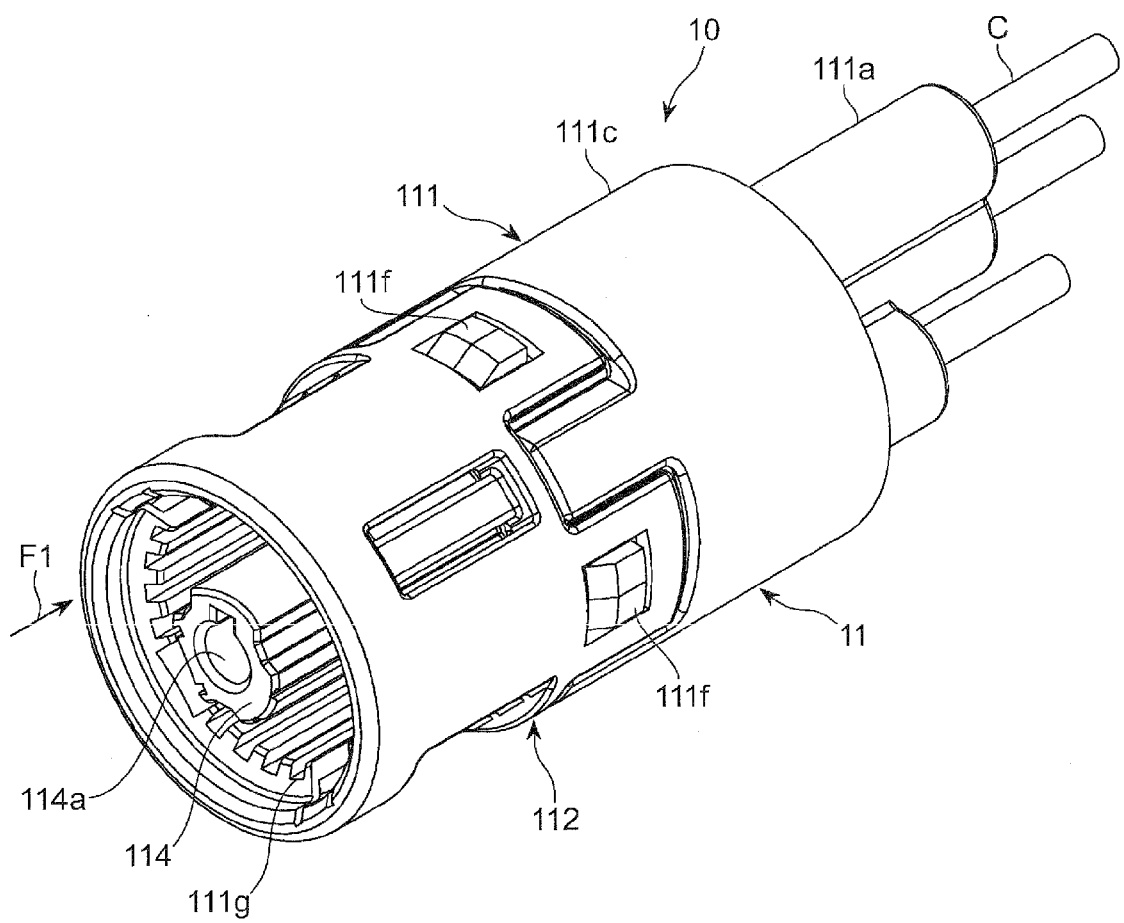
FIG. 1 is a perspective view of a mating electric connector into which an electric connector in accordance with the first embodiment of the present invention is fit.
Figure 6:
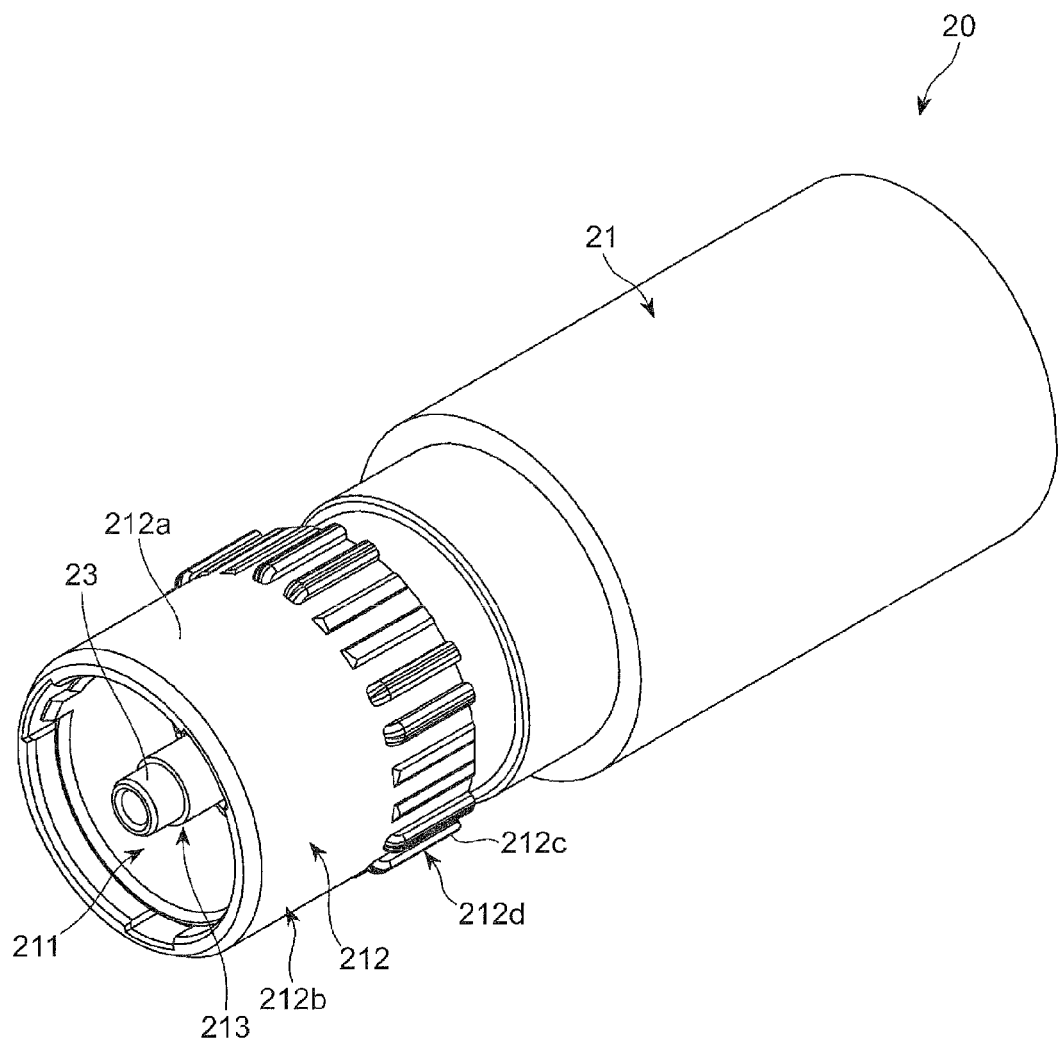
FIG. 6 is a perspective view of an electric connector in accordance with the first embodiment of the present invention.

An electric connector 20 in accordance with the first embodiment of the present invention, illustrated in FIG. 6 is used together with a mating electric connector 10 illustrated in FIG. 1 for connecting various connectors with a wire harness.

First, the mating electric connector 10 is explained hereinbelow with reference to FIGS. 1 to 5.

Figure 2:
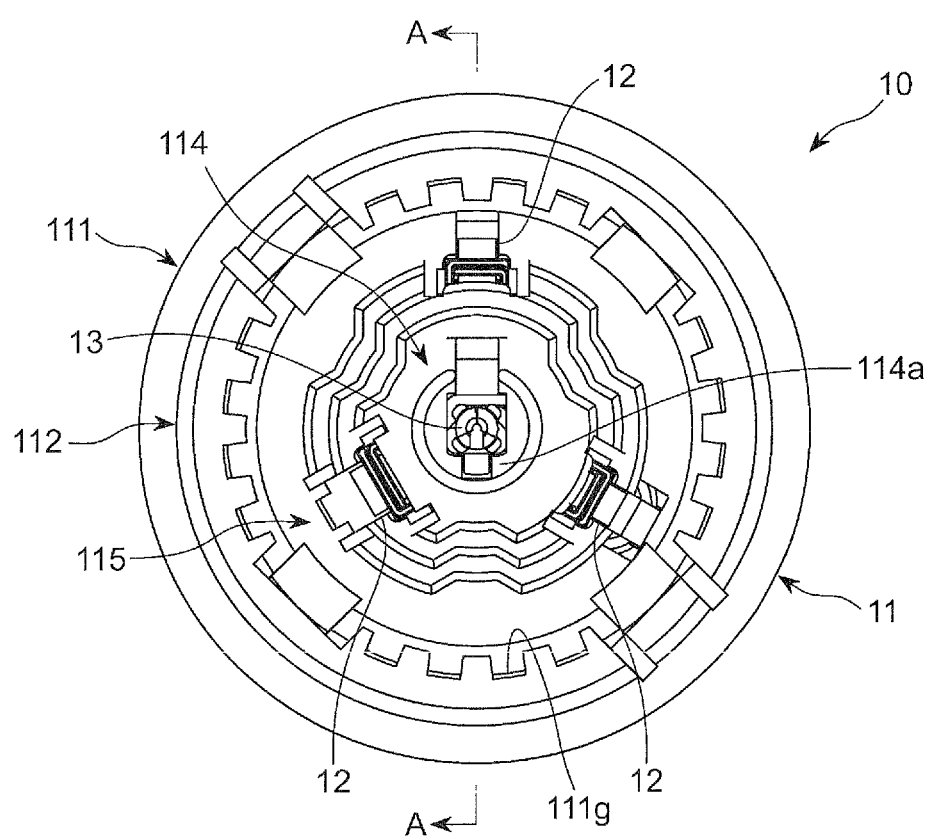
FIG. 2 is a front view of the mating electric connector illustrated in FIG. 1.
Figure 3:
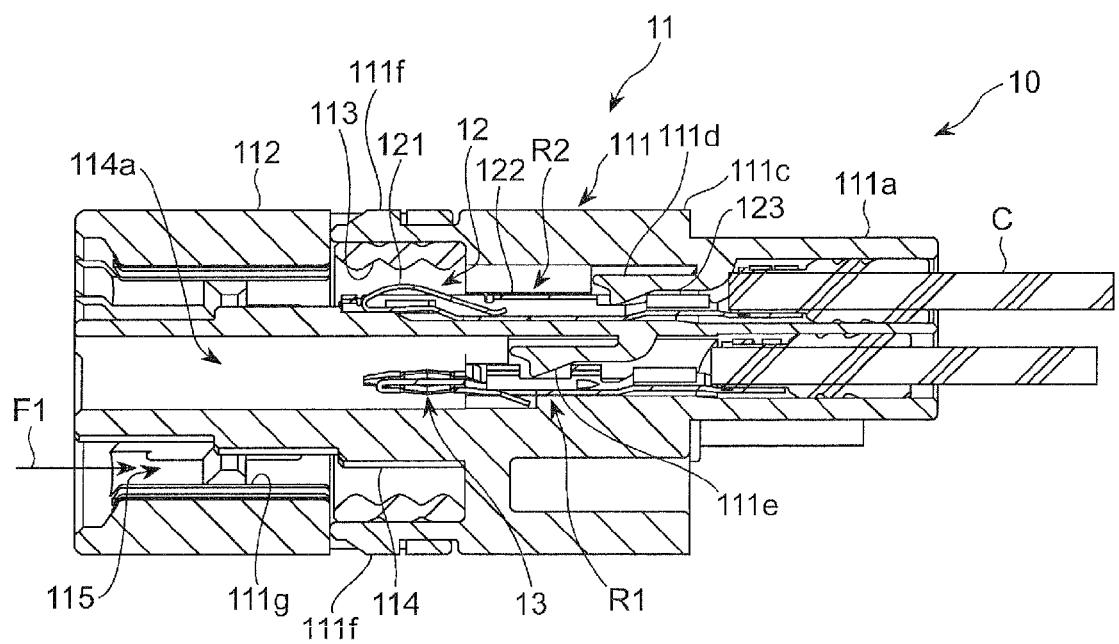
FIG. 3 is a cross-sectional view of the mating electric connector taken along the line A-A shown in FIG. 2.

As illustrated in FIGS. 1 to 3, the mating electric connector 10 includes an outer housing 11 into which the electric connector 20 is fit, a plurality of first contact terminals 12 through which the mating electric connector 10 is electrically connected with the electric connector 20, and a projecting terminal 13.

The outer housing 11 is cylindrical in shape. The outer housing 11 is comprised of a first part 111 and a second part 112.

The first part 111 includes a cover portion 111a at a rear end of the outer housing 111. The cover portion 111a protects a connector through which cables C are connected with the first contact terminals 12 and the projecting terminal 13. The first part 111 further includes a first shaft 114 defining therein a terminal space R1 in which the projecting terminal 13 is arranged. The first shaft 114 extends coaxially with an axis of the outer housing 111. The first shaft 114 is designed to have three stages each having a diameter increasing toward a proximal end from a distal end thereof. Specifically, the first shaft 114 includes a front end stage, a middle stage, and a rear end stage, in which the front stage has a diameter greater than the same of the middle stage, and the middle stage has a diameter greater than the same of the rear end stage.

The first shaft 114 is formed with a guide hole 114a extending axially thereof to lead to the terminal space R1.

The first part 111 includes a circumferential wall 111c defining a terminal space R2 between itself and the first shaft 114 for housing the first contact terminals 12 therein. The first part 111 includes lances 111d and 111e for preventing the first contact terminals 12 and the projecting terminal 13 housed in the terminal spaces R1 and R2, respectively, from being released out of the housing 11. The first part 111 also includes a locking piece 111f through which the first part 111 is engaged with the second part 112.

The second part 112 is cylindrical, and defines a first space 115 between the first shaft 114 and itself when coupled to the first part 111. The electric connector 20 illustrated in FIG. 6 is fit into the thus formed first space 115.

The first space 115 defined by the second part 112 includes at an inner surface thereof a plurality of linear grooves 111g arranged circumferentially of the mating electric connector 10 and extending in a length-wise direction F1 of the mating electric connector 10.

The first and second parts 111 and 112 are coupled to each other through an annular seal 113.

Each of the first contact terminals 12 includes a U-shaped flat spring 121, a hollow terminal body 122 having a rectangular cross-section and housed in the terminal space R2, and a bundling section 123 at which the cable C is fixed by being compressed thereonto.

The first contact terminals 12 are arranged on an outer surface of the first shaft 114. The first contact terminals 12 are circumferentially equally spaced away from one another around the first shaft 114. Specifically, the three first contact terminals 12 are arranged in the three stages by 120 degrees of a circumferential angle of the outer housing 11.

Figure 4:
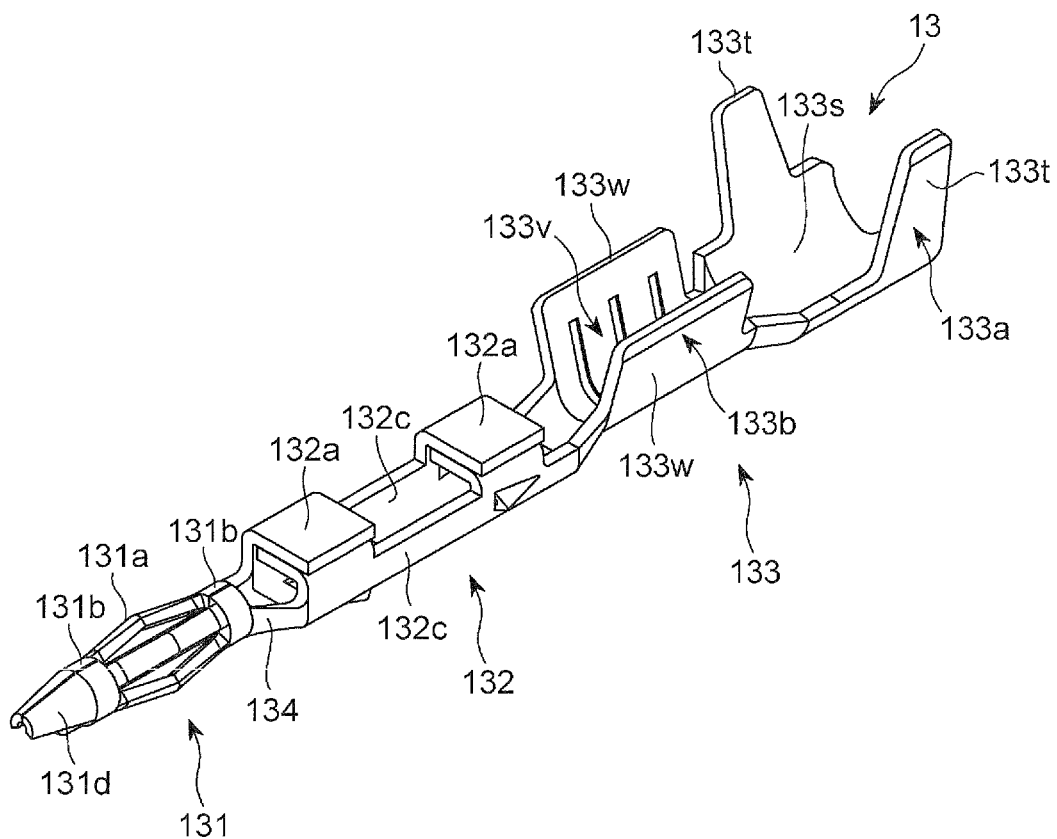
FIG. 4 is a perspective view of a projecting terminal as a part of the mating electric connector illustrated in FIG. 1.

The projecting terminal 13 is housed in the terminal space R1 formed at a distal end of the first shaft 114, and makes contact with a later-mentioned cylindrical terminal of the electric connector 20. As illustrated in FIG. 4, the projecting terminal 13 includes a contact portion 131, a terminal body 132, and a bundling portion 133.

The contact portion 131 includes a plurality of contact pieces 131a equally spaced away from one another, an inner shaft portion 131c (see FIG. 5) located in the contact pieces 131a, a pair of C-shaped binders 131b arranged at distal and proximal ends of the contact pieces 131a, and a tapered portion 131d continuous to the binder 131b located at distal ends of the contact pieces 131a.

The terminal body 132 is hollow and has a rectangular cross-section. The terminal body 132 includes a ceiling 132a formed with an opening with which the lance 111e (see FIG. 3) is engaged.

The bundling portion 133 compresses the cable C thereonto to fix the same therein. The bundling portion 133 includes an insulation barrel 133a and a wire barrel 133b.

The insulation barrel 133a includes a pair of projections 133t upwardly projecting at sides thereof, and a floor 133s on which the cable C is put. By folding the projections 133t onto the cable C put on the floor 133s, the cable C is fixed in the insulation barrel 133a.

The wire barrel 133b includes a pair of projections 133w upwardly projecting at sides thereof, and a floor 133v on which core of the cable C is put. By folding the projections 133w onto the core of the cable C put on the floor 133v, the core of the cable C is fixed in the wire barrel 133b with the core being electrically connected with the wire barrel 133b.

The projecting terminal 13 is formed of a single metal sheet.

Figure 5:
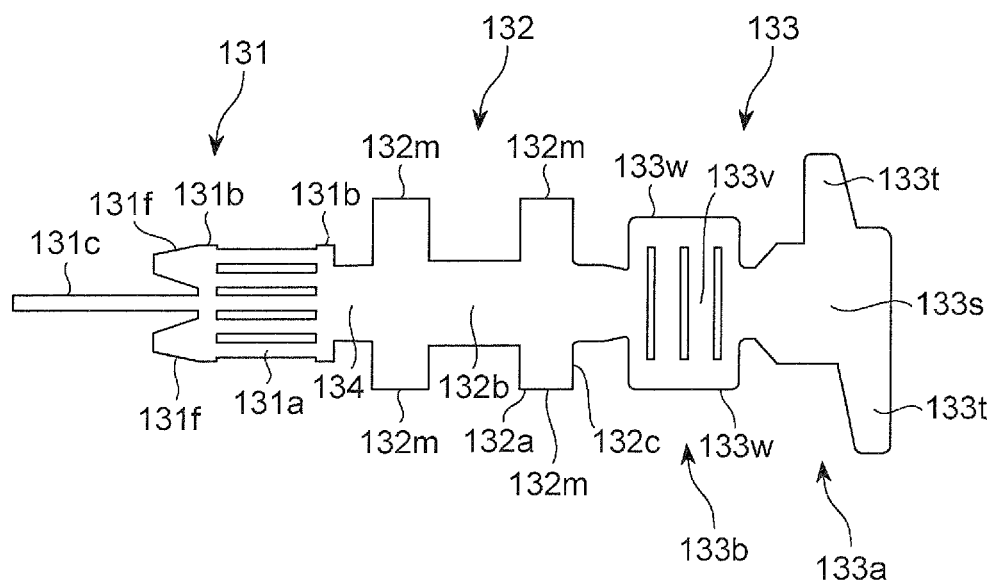
FIG. 5 is a plan view of a metal sheet from which the projecting terminal illustrated in FIG. 4 is fabricated.

Firstly, a metal sheet is punched into a shape obtained when the projecting terminal 13 is developed into a plane. FIG. 5 illustrates a metal sheet punched into the shape.

Then, portions of the metal sheet defining the contact pieces 131a are bent such that they outwardly project.

Then, the inner shaft portion 131c is bent at a proximal portion thereof such that the inner shaft portion 131c lies above inner surfaces of the contact pieces 131a.

Then, the binders 131b is bent into a C-shape such that they surround the inner shaft portion 131c.

Then a pair of trapezoidal projections 131f is bent into a tapered shape to thereby define the tapered portion 131d.

Thus, there is completed the contact portion 131.

The terminal body 13 is fabricated as follows.

Firstly, rectangular projections 132m outwardly extending at distal and proximal ends of the floor 132b are caused to stand to thereby define sidewalls 132c standing from side edges of the floor 132b.

Then, the projections 132m are bent at distal ends thereof such that they overlap one on another. Thus, there is formed the ceiling 132a.

Thus, there is completed the terminal body 132.

The binders 131 are bent into a C-shape, and the projections 132m are caused to stand to thereby define the sidewalls 132c, resulting in that there is formed a deformable portion 134 between the contact portion 131 and the terminal body 132. The deformable portion 134 has a width varying or increasing from a width equal to a diameter of the binder 131b to a width equal to a space between the sidewalls 132c.

The cable C is bundled in the bundling portion 133 as follows.

Firstly, an outer cover of the cable C is peeled off to expose a core. Then, the cable C is put on the floor 133s of the insulation barrel 133a, and the exposed core is put on the floor 133v of the wire barrel 133b.

Then, the projections 133t of the insulation barrel 133a are folded onto the cable C, and the projections 133w of the wire barrel 133b are folded onto the core such that the projections 133 male contact with the core.

Thus, the cable C is fixed in the bundling portion 133 with the cable C being electrically connected with the bundling portion 133.

Hereinbelow is explained the electric connector 20 in accordance with the first embodiment of the present invention, with reference to FIGS. 6 to 10.

Figure 7:
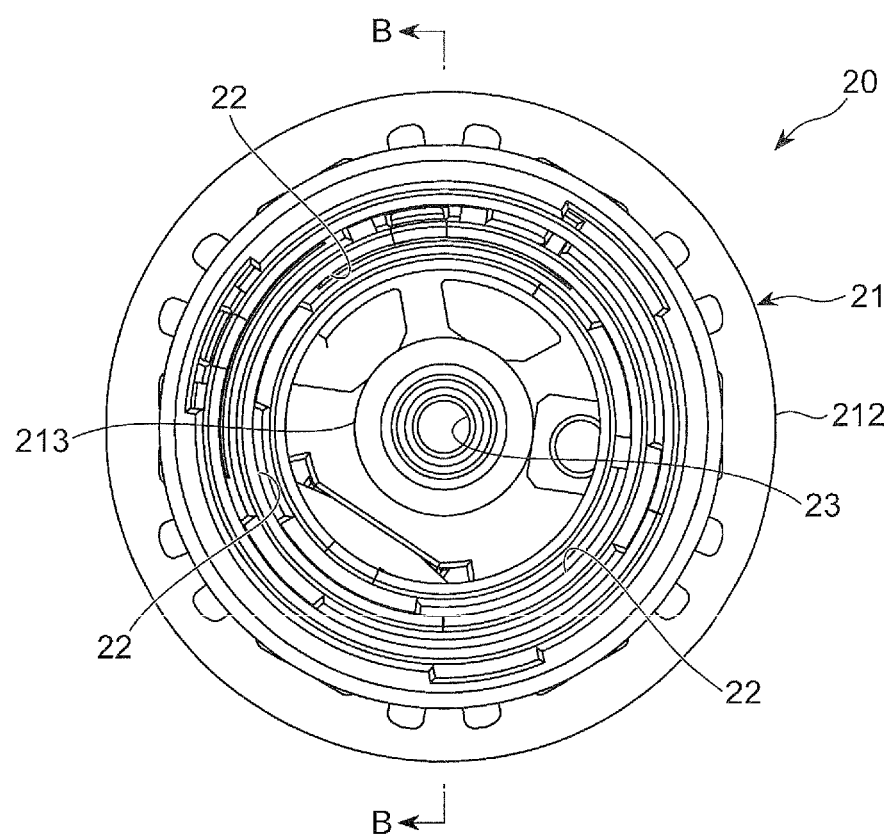
FIG. 7 is a front view of the electric connector illustrated in FIG. 6.
Figure 8:
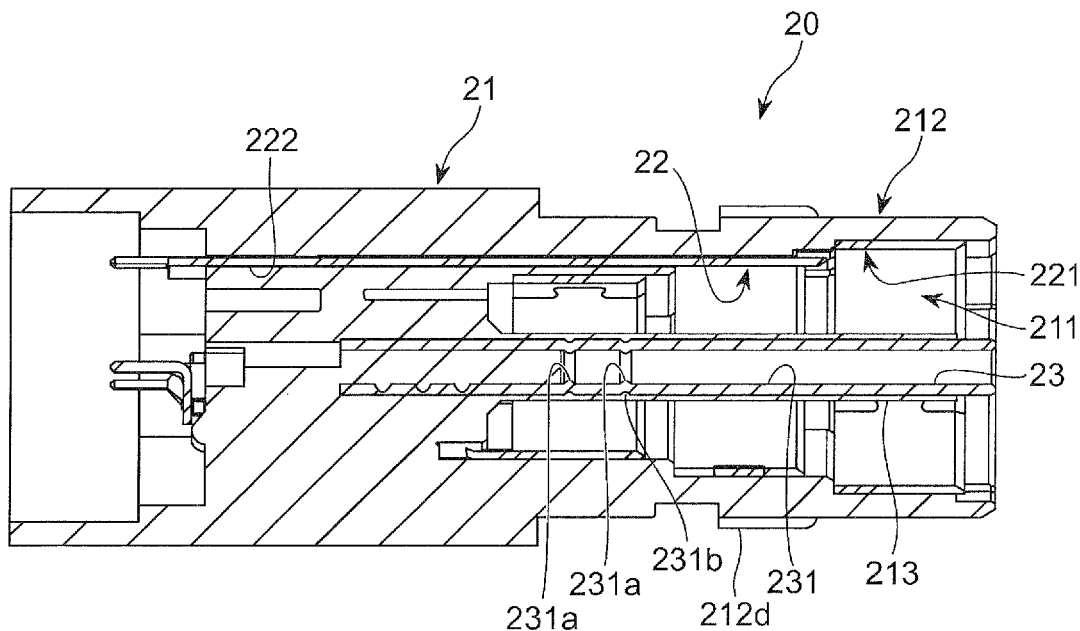
FIG. 8 is a cross-sectional view of the electric connector taken along the line B-B shown in FIG. 7.

As illustrated in FIGS. 6 to 8, the electric connector 20 includes an inner housing 21 to be fit into the mating electric connector 10 illustrated in FIG. 1, a plurality of second contact terminals 22 electrically connecting with the first contact terminals 12 of the mating electric connector 10 when the electric connector 20 is fit into the mating electric connector 10, and a cylindrical terminal 23 electrically connecting with the projecting terminal 13 of the mating electric connector when the electric connector 20 is fit into the mating electric connector 10.

The inner housing 21 includes a circumferential wall 212 as a front half of the inner housing 21. The circumferential wall 212 defines therein a second space 211 into which the first shaft 114 of the mating electric connector 10 (see FIG. 1) is fit. The second space 211 is comprised of a plurality of stages each having an inner diameter gradually decreasing from an opening end toward a rear. The circumferential wall 212 has an outer surface 212a making contact with an inner surface of the first space 115 when the electric connector 20 is fit into the first space 115 of the mating electric connector 10. The circumferential wall 212 defines at a front half thereof a cylindrical portion 212 on which no projections are formed, and defines at a rear half thereof a gear portion 212d in which a plurality of linear projections 212c each extending in a length-wise direction of the electric connector 20 are formed circumferentially thereof.

A second shaft 213 extends in the second space 211. The second shaft 213 is cylindrical in shape, and includes the cylindrical terminal 23 arranged therein.

The three second contact terminals 22 are arranged on an inner surface of the inner housing 21. Each of the second contact terminals 22 includes a cylindrical contact portion 221, and a linear contact portion 222.

The contact portion 221 makes contact with the flat spring portion 121 of the first contact terminal 12 illustrated in FIG. 3. Each of the contact portions 221 is housed in each of the three stages of the second space 211. Each of the three contact portions 221 is designed to have a diameter different from one another in accordance with a diameter of the three stages of the second space 211.

The contact portion 222 straightly extends from the contact portion 221 toward a rear end of the inner housing 21, and has a distal end situated beyond the inner housing 21. The contact portion 222 is electrically connected to a printed circuit board (not illustrated) through the distal end thereof.

The cylindrical terminal 23 is housed in the second shaft 213. The cylindrical terminal 23 has a distal end through which the projecting terminal 13 is inserted thereinto. The cylindrical terminal 23 outwardly extends beyond the second shaft 213, and thus, is exposed at a distal end thereof out of the second shaft 213. The cylindrical terminal 23 is arranged to make close contact with and to be integral with the second shaft 213.

Figure 9:
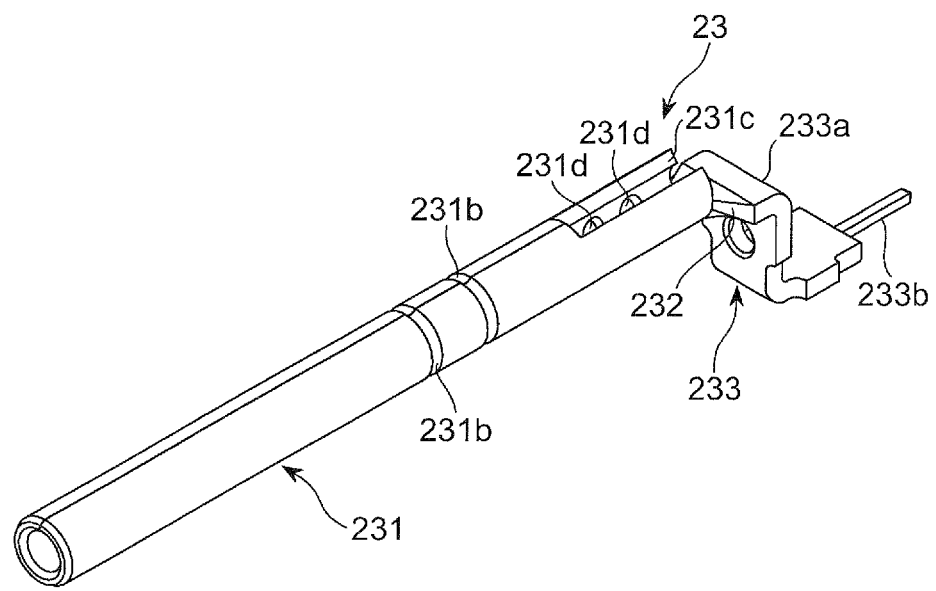
FIG. 9 is an upper perspective view of a cylindrical terminal as a part of the electric connector illustrated in FIG. 6.

As illustrated in FIG. 9, the cylindrical terminal 23 includes a cylindrical portion 231, a L-shaped connection portion 233, and a deformable portion 232 through which the cylindrical portion 231 and the connection portion 233 are connected to each other.

The cylindrical portion 231 is formed therein with a plurality of annular projections 231a at a location beyond a location at which the inserted projecting terminal 13 reaches. Each of the annular projections 231a projects from an inner wall toward an inner space of the cylindrical portion 213. Each of the annular projections 231a acts as a structure for preventing molten resin from flowing into an area at which the cylindrical terminal 23 and the projecting terminal 13 make contact with each other while an inserting-molding process is being carried out.

The cylindrical portion 231 is designed to be formed with two annular projections 231a arranged in a length-wise direction thereof. The cylindrical portion 231 includes at an outer surface thereof annular recesses 231b at the same location as a location at which the annular projections 231a are formed on an inner surface of the cylindrical portion 231.

As illustrated in FIG. 9, the cylindrical portion 231 includes at a proximal end thereof with a rectangular elongate cut-out 231c. Furthermore, the cylindrical portion 231 is formed at a circumferential wall thereof with three through-holes 231d arranged in a length-wise direction of the cylindrical portion 231. The through-holes 231d are exposed to the cut-out 231c.

The connection portion 233 includes a plate-shaped portion 233a bending perpendicularly to the cylindrical portion 231, and further, perpendicularly bending to be in parallel with the cylindrical portion 231, and a needle portion 233b outwardly extending from a distal end of the plate-shaped portion 233a.

The cylindrical terminal 23 is formed from a single metal sheet.

Figure 10:
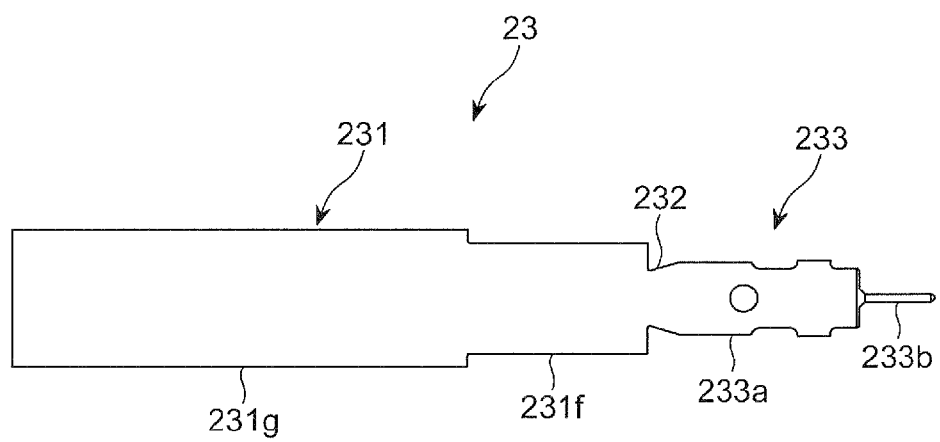
FIG. 10 is a plan view of a metal sheet from which the cylindrical terminal illustrated in FIG. 9 is fabricated.

Firstly, a metal sheet is punched into a shape obtained when the cylindrical terminal 23 is developed into a plane. FIG. 10 illustrates the shape.

Then, there is prepared a die used for a pressing process. The die includes spotted projections for compressing a first portion 231f defining a part of the cylindrical portion 231, and a linear projection for compressing a second portion 231g defining the rest of the cylindrical portion 231. The die is compressed onto the metal sheet at a surface making an outer surface of the cylindrical portion 231.

Then, a beading process is carried out by compressing the linear projection of the die onto the metal sheet, resulting in that the annular projection 231a is formed on one of the surfaces, and the annular recess 231b is formed on the other surface. The spotted projections of the die are compressed onto the metal sheet to thereby form the through-holes 231d.

Then, a bar-shaped die having a circular cross-section is put on both the first portion 231f and the second portion 231g having a width greater than the same of the first portion 231f. Then, the first and second portions 231f and 231g are rounded around the bar-shaped die. Then, side edges of the first and second portions 231f and 231g are caused to make contact with each other. Thus, there is completed the cylindrical portion 231.

A portion of the metal sheet defining the connection portion 233 is bent perpendicularly to the cylindrical portion 231, and further perpendicularly bent to be in parallel with the cylindrical portion 231. Thus, there is completed the connection portion 233.

By rounding the first and second portions 231f and 231g, there is defined the deformable portion 232 between the cylindrical portion 231 and the connection portion 233. The deformable portion 232 has a width gradually increasing from an arcuate portion of the cylindrical portion 231 to a plate portion of the connection portion 233.

How the electric connector 10 in accordance with the first embodiment of the present invention, having the structure as mentioned above, is used is explained hereinbelow with reference to FIGS. 11 to 14.

Figure 11:
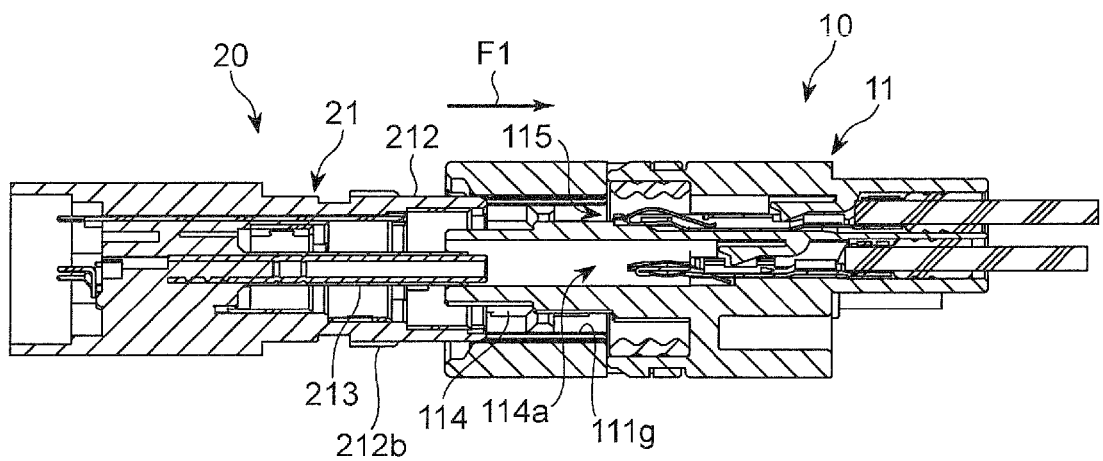
FIG. 11 is a cross-sectional view of the mating electric connector illustrated in FIG. 1 and the electric connector in accordance with the first embodiment of the present invention, showing a condition before they are fit into each other.
Figure 12:
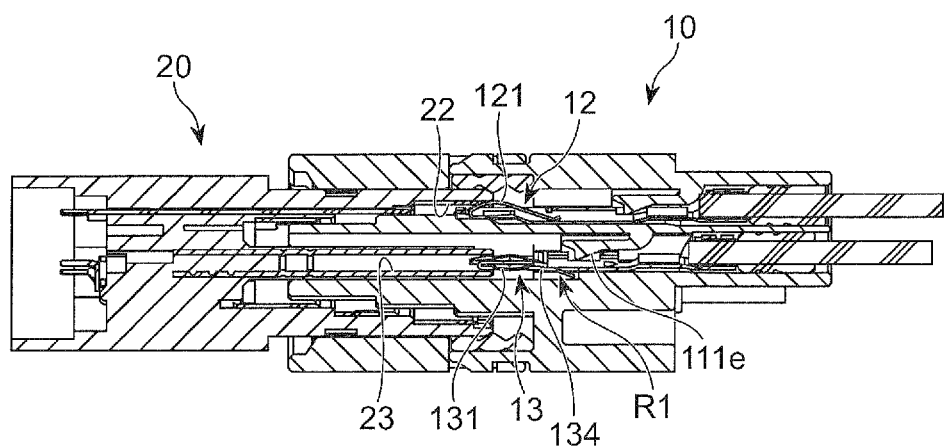
FIG. 12 is a cross-sectional view of the mating electric connector illustrated in FIG. 1 and the electric connector in accordance with the first embodiment of the present invention, showing a condition that they are being fit into each other.

As illustrated in FIG. 11, the electric connector 10 and the mating electric connector 20 are caused to come close to each other. Then, the circumferential wall 212 of the inner housing 21 is aligned at a distal end thereof with the first space 115 of the outer housing 11, and the second shaft 213 of the inner housing 21 is aligned at a distal end thereof with the guide hole 114a of the first shaft 114.

Then, the circumferential wall 212 of the inner housing 21 is advanced in the length-wise direction F1 of the first space 115, and the second shaft 213 of the inner housing 21 is advanced in the length-wise direction F1 of the guide hole 114a.

The circumferential wall 212 of the inner housing 21 defines at a front half thereof the cylindrical portion 212b on which no projections are formed. Accordingly, when the circumferential wall 212 is inserted only at a front half thereof into the first space 115 of the outer housing 11, the linear projections 212c are not yet fit into the linear grooves 111g of the outer housing 11. Thus, a user can fit the outer housing 21 into the inner housing 11 with one of them being rotated around an axis thereof. A user can forward the inner housing 21 relative to the outer housing 11 without noticing a direction in which one of the inner housing 21 and the outer housing 11 is in rotation.

Thus, the electric connector 20 can be fit into the mating electric connector 10 without limitation about a direction in which the electric connector 20 is in rotation about an axis thereof relative to the mating electric connector 10.

When the circumferential wall 212 of the inner housing 21 is wholly advanced into the first space 115 of the outer housing 11, the linear projections 212c of the circumferential wall 212 are fit into the linear grooves 111g of the outer housing 11. Accordingly, the outer and inner housings 11 and 21 cannot rotate relative to each other.

Furthermore, when the circumferential wall 212 is wholly advanced into the first space 115, each of the second contact terminals 22 arranged in the electric connector 20 makes contact with the flat spring portion 121 of each of the first contact terminals 12 arranged in the mating electric connector 10.

Since the outer and inner housings 11 and 21 are prohibited from rotating relative to each other with the projecting 13 making contact with the cylindrical terminal 23 and further with the second contact terminals making contact with the flat spring portions 121, it is possible to prevent those terminals from rubbing each other to thereby be damage or worn out.

If an axis of the cylindrical terminal 23 is deviated from an axis of the projecting terminal 13 when the projecting terminal 13 is fit into the cylindrical terminal 23, a posture in which the contact portion 131 of the projecting terminal 13 is inserted into the cylindrical terminal 23 is corrected with the contact portion 131 sliding on an inner surface of the cylindrical terminal 23.

However, the projecting terminal 13 is housed in the terminal space R1 with a gap between the projecting terminal 13 and an inner surface of the first shaft 114, and further, is locked by the lance 111e. Accordingly, even if the posture of the contact portion 131 is corrected by the cylindrical terminal 23, the terminal body 132 of the projecting terminal 13 is shifted in a direction in which the posture of the contact portion 131 is corrected, and thus, the projecting terminal 13 can be caused to move in an axial direction of the cylindrical terminal 23.

The projecting portion 13 includes the deformable portion 134 between the contact portion 131 and the terminal body 132. Accordingly, when the contact portion 131 is directed in another direction as fitting into the cylindrical terminal 23, the deformable portion 134 is elastically deformed. Accordingly, even if the posture of the contact portion 131 when the contact portion 131 of the projecting terminal 13 is inserted into the cylindrical terminal 23 is corrected by the cylindrical terminal 23, it is possible to reduce influence exerted on the terminal body 132 due to the correction.

Figure 13:
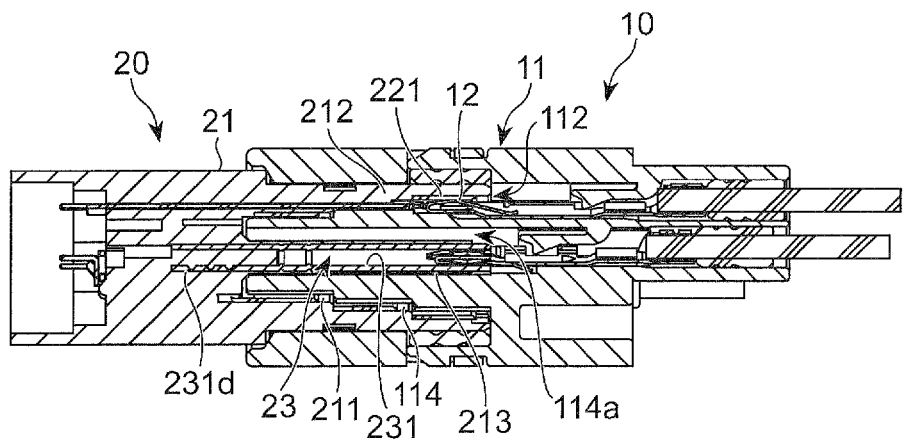
FIG. 13 is a cross-sectional view of the mating electric connector illustrated in FIG. 1 and the electric connector in accordance with the first embodiment of the present invention, showing a condition after they have been fit into each other.

As illustrated in FIG. 13, when the electric connector 20 is inserted further into the mating electric connector 10, the circumferential wall 212 of the inner housing 21 advances deeply into the first space 115 of the outer housing 11, the first shaft 114 of the outer housing 11 advances deeply into the second space 211 of the inner housing 21, and the second shaft 213 of the inner housing 21 advances deeply into the guide hole 114a of the first shaft 114.

Thus, each of the first contact terminals 12 arranged on an outer surface of the first shaft 114 makes contact with each of the contact portions 221 of the second contact terminals 22 arranged on an inner surface of the inner housing 21. The contact portion 131 of the projecting terminal 13 is in a condition of being fit in the cylindrical portion 231 of the cylindrical terminal 23 to thereby make contact with the cylindrical portion 231.

Since the contact pieces 131a of the contact portion 131 have contact surfaces outwardly oriented along entire circumference of the contact portion 131, the contact portion 131 can make stable contact with an inner surface of the cylindrical portion 231.

The electric connector 20 and the mating electric connector 10 are fit into each other in the above-mentioned manner.

A method of fabricating the electric connector 20 is explained hereinbelow with reference to FIG. 14.

Firstly, the second contact terminals 22 and the cylindrical terminal 23 are set in a die (not illustrated) formed with a cavity by which the inner housing 21 of the electric connector 20 is to be formed.

As a result of setting the second contact terminals 22 and the cylindrical terminal 23 in the die, the contact portions 222 of the second contact terminals 22 are supported with the die, and further, the cylindrical portion 231 of the cylindrical terminal 23 is supported at a distal end thereof with the die.

Figure 14:
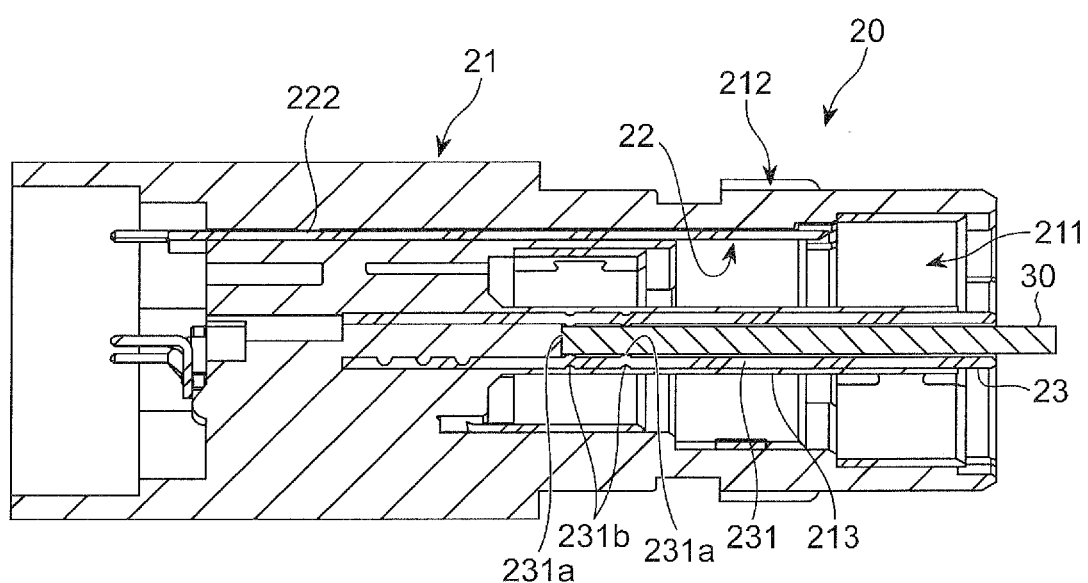
FIG. 14 is a cross-sectional view of the electric connector in accordance with the first embodiment of the present invention, showing a step of the method of fabricating the electric connector.

Then, as illustrated in FIG. 14, a die 30 in the form of a round bar is inserted into the cylindrical terminal 23 through a distal end of the cylindrical terminal 23 into which the projecting terminal 13 (see FIG. 12) is later inserted. The die 30 has a diameter smaller than a diameter of an opening of the cylindrical portion 231, and equal to an inner diameter of the annular projections 231a.

In insertion of the die 30 into the cylindrical portion 231 of the cylindrical terminal 23, since the die 30 has a diameter smaller than a diameter of a distal portion of the cylindrical portion 231, the die 30 can be advanced into the cylindrical portion 231 without any resistance.

Since the die 30 is designed to have a diameter equal to an inner diameter of the annular projections 231a, when the die 30 arrives at the first annular projection 231a, the die 30 is subject to a resistance caused by slide contact of the die 30 with the annular projection 231a. Accordingly, the die 30 is pushed by a user into the cylindrical portion 231 with an intensive force.

The cylindrical portion 231 in the first embodiment is designed to include the two annular projections 231a. Thus, the die 30 is inserted into the cylindrical portion 231 until the die 30 arrives at the second annular projection 231a, that is, the annular projection 231a located deeply of the cylindrical portion 231. Thus, the die 30 is now in a condition of making contact with the two annular projections 231a.

Then, molten resin is poured into the cavity of the die with the die 30 being supported in the above-mentioned way, to thereby form the inner housing 21.

The molten resin enters the cylindrical portion 23 through a rear end (through which the cylindrical portion 231 and the contact portion 233 are connected to each other) opening of the cylindrical portion 231. The die 30 inserted into the cylindrical portion 231 makes contact with the annular projections 231a to thereby close gaps between the cylindrical terminal 23 and the die 30. Accordingly, the molten resin is prevented from flowing into the cylindrical portion 231 beyond the annular projections 231a.

Thus, the molten resin is prevented from flowing into an area at which the cylindrical terminal 23 and the projecting terminal 13 make contact with each other, ensuring a space in the cylindrical terminal 23 into which the projecting terminal 13 is inserted while the inner housing 21 is being formed. Thus, the inner housing 21 is formed integrally with the second contact terminals 22 and the cylindrical terminal 23 by an insertion-molding process.

Since the cylindrical portion 231 is formed with the two annular projections 231a, even if the molten resin passes through the first annular projection 231a, the molten resin is stopped by the second annular projection 231a. Thus, the molten resin is surely prevented from flowing into an area at which the cylindrical terminal 23 and the projecting terminal 13 make contact with each other, ensuring a space into which the projecting terminal 13 is inserted.

The cylindrical portion 231 is formed on an outer surface thereof with the annular recesses 231b by beading in alignment with the annular projections 231a. Thus, a contact area at which the inner housing 21 and the cylindrical terminal 23 make contact with each other is increased, and the inner housing 21 can have projections derived from the molten resin entering the annular recesses 231b. Accordingly, when the mating electric connector 10 is pulled out of the electric connector 20, it is possible to prevent the cylindrical terminal 23 from being pulled out of the second shaft 213 together with the mating electric connector 10.

Furthermore, the molten resin does not flow into the cylindrical terminal 23 beyond the annular projections 231a, but flow into the cylindrical terminal 23 in an area not beyond the annular projections 231a, that is, at a rear end of the cylindrical terminal 23. The cylindrical portion 231 is formed at a rear end thereof with the through-holes 231d. Accordingly, since the molten resin enters the through-holes 231d, the inner housing 21 can be engaged to the cylindrical terminal 23 through the resin in the through-holes 231d. Thus, the cylindrical terminal 23 can have an increased resistance against being pulled out, ensuring that it is possible to surely prevent the cylindrical terminal 23 from being pulled out.

Since the cylindrical portion 231 is formed with the through-holes 231d, the molten resin flows into the cylindrical portion 231 not only through a proximal end thereof, but also through the through-holes 231d. Accordingly, the through-holes 231d facilitates the molten resin to flow into the cylindrical portion 231 in an area between a proximal end of the cylindrical portion 231 and the annular projections 231a.

Second Embodiment

In the electric connector 20 in accordance with the first embodiment, the structure for preventing molten resin from flowing into an area at which the cylindrical terminal 23 and the projecting terminal 13 make contact with each other while an inserting-molding process is being carried out is comprised of the annular projections 231a. In the electric connector in accordance with the second embodiment, the structure is comprised of a closed section comprising a closed proximal end of the cylindrical terminal 23 in place of the above-mentioned annular projections 231a.

Parts or elements that correspond to those of the first embodiment have been provided with the same reference numerals, and operate in the same manner as corresponding parts or elements in the first embodiment, unless explicitly explained hereinbelow.

Figure 15:
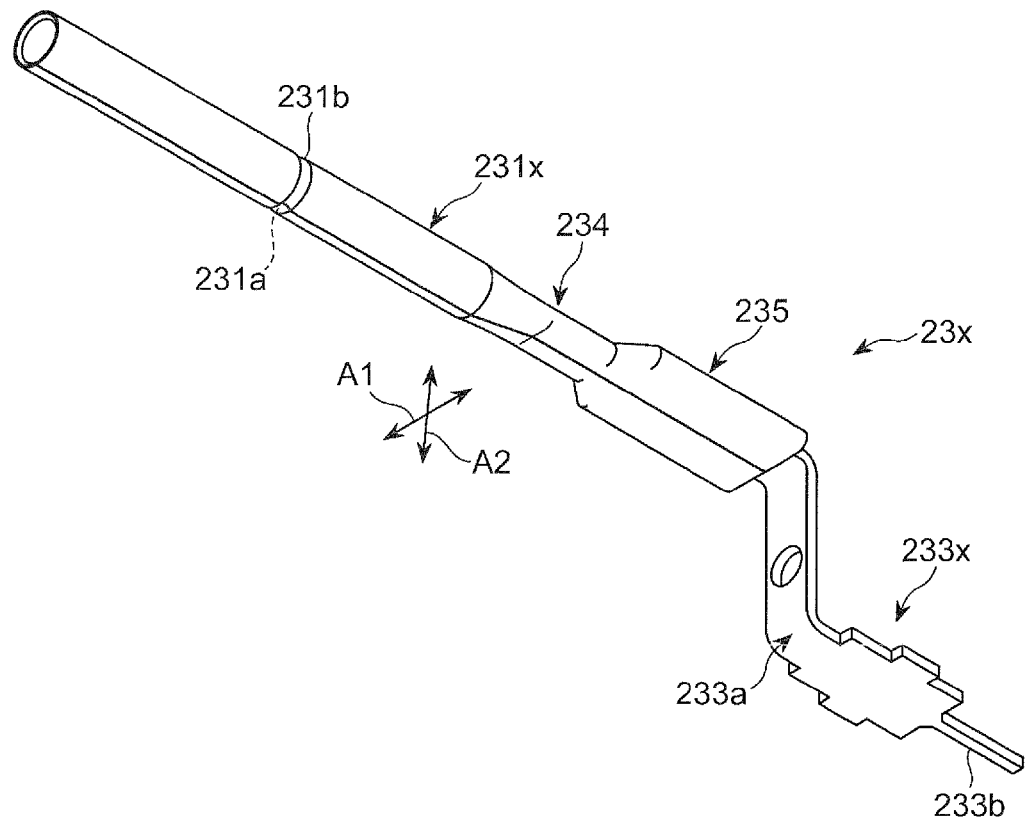
FIG. 15 is a lower perspective view of a cylindrical terminal as a part of the electric connector in accordance with the second embodiment of the present invention.
Figure 16:
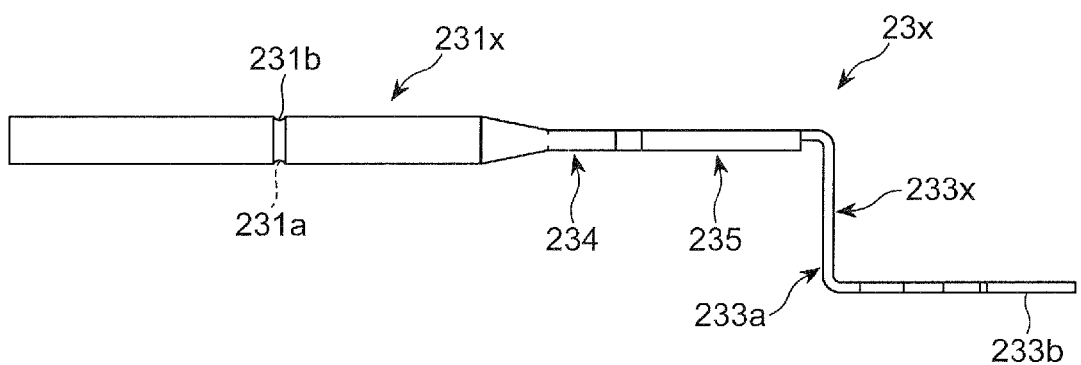
FIG. 16 is a side view of the cylindrical terminal illustrated in FIG. 15.
Figure 17:
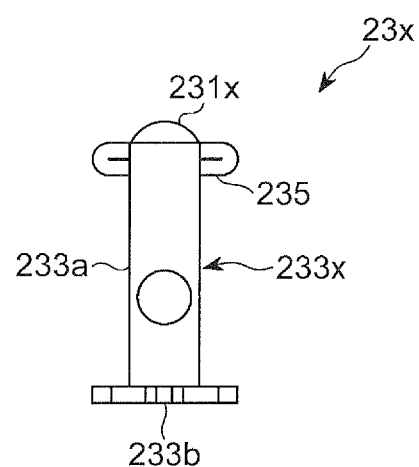
FIG. 17 is a rear view of the cylindrical terminal illustrated in FIG. 15.
Figure 18:
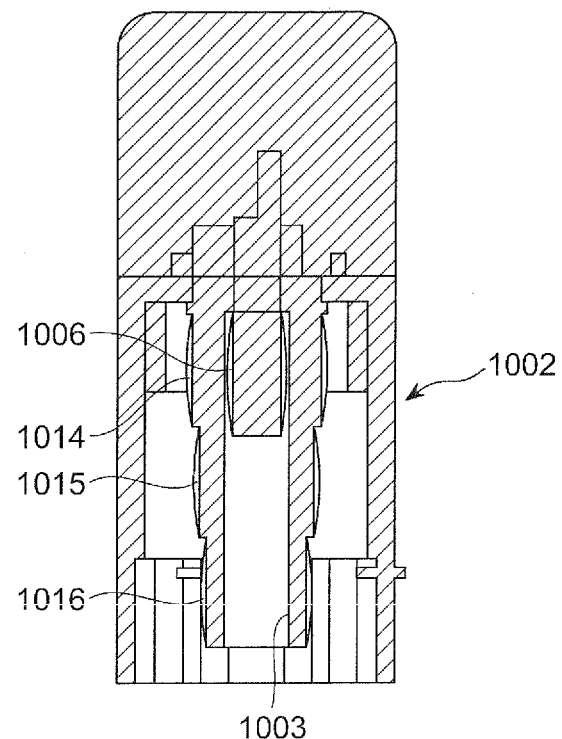
FIG. 18 is a cross-section view of a conventional glow plug connector.
Figure 18:
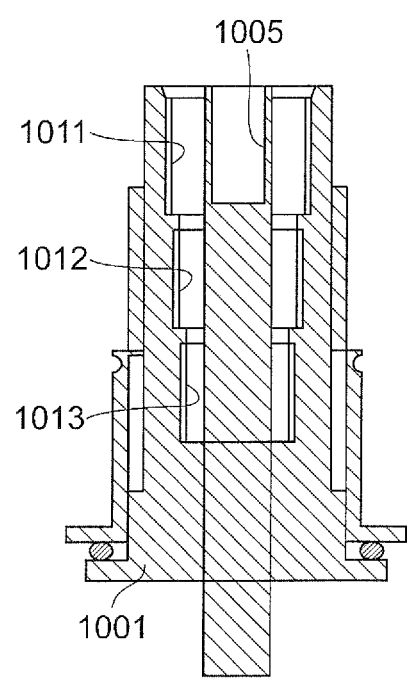
Figure 19:
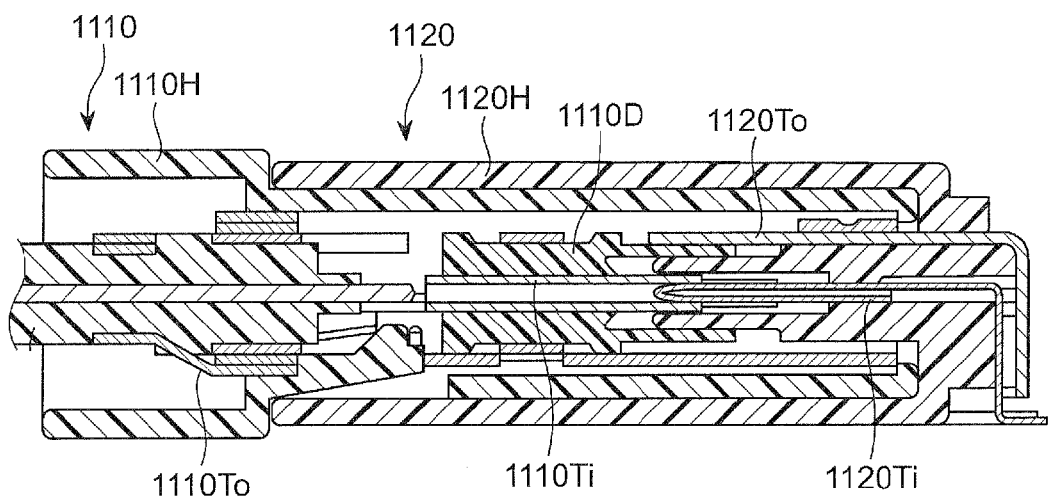
FIG. 19 is a cross-sectional view of a conventional coaxial connector.

As illustrated in FIGS. 15 to 17, a cylindrical terminal 23x is housed in the second shaft 213 of the inner housing 21, similarly to the cylindrical terminal 23 in the first embodiment.

The cylindrical terminal 23x includes a cylindrical portion 231x formed with the single annular projection 231a beyond a location at which the projecting terminal 13 arrives. Similarly to the first embodiment, the annular projection 231a prevents molten resin from flowing into an area at which the cylindrical terminal 23 and the projecting terminal 13 make contact with each other while an inserting-molding process. The cylindrical portion 231x is formed on an outer surface thereof further with the annular recess 231b in alignment with the annular projection 231a.

The cylindrical terminal 23x includes a reduced-thickness portion 234 at the rear of the cylindrical portion 231x. The reduced-thickness portion 234 is formed by gradually reducing a thickness of the cylindrical portion 231x in a lengthwise direction of the cylindrical portion 231x, that is, gradually reducing a diameter of the cylindrical portion 231x in a horizontal direction A2 with a diameter of the cylindrical portion 231x in a vertical direction A1 perpendicular to the direction A2, being kept as it is. The reduced-thickness portion 234 is flat as a whole.

The cylindrical terminal 23x further includes a closed section 235 at the rear of the reduced-thickness portion 234 and at a proximal end of the cylindrical terminal 23x. The closed section 235 has a width (a length in the direction A1) greater than the same of the reduced-thickness portion 234. As illustrated in FIG. 17, the closed section 235 has a thickness smaller than a diameter of the cylindrical portion 231x and a width greater than a diameter of the cylindrical portion 231x.

The cylindrical terminal 23x further includes a L-shaped connection portion 233x continuous to the closed section 235. The connection portion 233x includes a plate-shaped portion 233a bending perpendicularly to the closed section 235, and further, perpendicularly bending to be in parallel with the cylindrical portion 231x, and a needle portion 233b outwardly extending from a distal end of the plate-shaped portion 233a.

The cylindrical terminal 23x is formed from a single metal sheet.

Firstly, a metal sheet is punched into a shape obtained when the cylindrical terminal 23x is developed into a plane.

Then, there is prepared a die used for a pressing process, and including a linear projection. The die is compressed onto a rectangular portion of the metal sheet defining an outer surface of the cylindrical portion 231x, the reduced-thickness portion 234, and the closed section 235. By carrying out a beading process, that is, by compressing the linear projection of the die onto the metal sheet, the annular projection 231a is formed on one of the surfaces of the metal sheet, and the annular recess 231b is formed on the other surface of the metal sheet.

Then, a bar-shaped die having a circular cross-section is put on the beaded metal sheet. Then, the metal sheet is rounded around the bar, and then, side edges of the rounded metal sheet are caused to make contact with each other. Thus, the metal sheet is turned into a metal cylinder having a uniform diameter and integrally defining the cylindrical portion 231x, and reduced-thickness portion 234 before collapsed, and the closed section 235 before collapsed.

Then, a portion of the metal sheet defining the closed section 235 is vertically sandwiched to thereby be collapsed. By being collapsed, the closed section 235 is turned from a cylindrical shape into a flat shape, resulting in that the closed section 235 is expanded in a direction perpendicular to a direction in which the closed section 235 is collapsed, and hence, the closed section 235 has no inner space. The reduced-thickness portion 234 is compressed together with the closed section 235 in a direction in which the closed section 235 is compressed, when the closed section 235 is collapsed into a flat shape.

In accordance with the above-mentioned steps, the cylindrical portion 231x, the reduced-thickness portion 234, and the closed section 235 of the cylindrical terminal 23x are formed from a single metal sheet.

A portion of the metal sheet defining the connection portion 233 is bent perpendicularly to the cylindrical portion 231x, and further perpendicularly bent to be in parallel with the cylindrical portion 231x. Thus, there is completed the connection portion 233.

Similarly to the first embodiment, the second contact terminals 22 and the cylindrical terminal 23x are set in a die (not illustrated) formed with a cavity by which the inner housing 21 of the electric connector 20 is to be formed by an insertion-molding process.

As a result of setting the second contact terminals 22 and the cylindrical terminal 23x in the die, the contact portions 222 of the second contact terminals 22 are supported with the die, and further, the cylindrical portion 231x of the cylindrical terminal 23x is supported at a distal end thereof with the die.

Then, molten resin is poured into the cavity. The closed section 235 is formed at a proximal end opposite to a distal end of the cylindrical terminal 23x through which the projecting terminal 13 (see FIG. 4) is inserted into the cylindrical terminal 23x, and thus, the cylindrical terminal 23x is closed at a proximal end thereof. Thus, the closed section 235 prevents molten resin from flowing into an inner space of the cylindrical terminal 23x through a proximal end of the cylindrical terminal 23x, and accordingly, it is possible to prevent molten resin from flowing into an area at which the cylindrical terminal 23x and the projecting terminal 13 make contact with each other while the inserting-molding process is being carried out.

Since the closed section 235 can be formed by a pressing process, the cylindrical terminal 23x can be readily closed at a proximal end thereof.

In the first and second embodiments, the terminals 23 and 23x are designed to be cylindrical, that is, to have a circular cross-section. It should be noted that if only the contact pieces 131a of the projecting terminal 13 can make contact with an inner surface of the terminals 23 and 23x, the terminals 23 and 23x may be designed to have a rectangular cross-section.

The cylindrical terminal 23 (see FIG. 9) in the first embodiment is designed to include the two annular projections 231a. It should be noted that the cylindrical terminal 23 may be designed to include three or more annular projections 231a.

The cylindrical terminal 23x (see FIG. 15) in the second embodiment is designed to include the single annular projection 231a. It should be noted that the cylindrical terminal 23x may be designed to include two or more annular projections 231a.

INDUSTRIAL APPLICABILITY

The electric connector in accordance with the present invention can be used as a connector equipped in a glow plug, a connector for connecting a combustion pressure sensor and a wire harness to each other, a connector for connecting cables to each other, a connector equipped in various electric/electronic devices, and a connector equipped in an automobile. The electric connector in accordance with the present invention can be employed broadly in fields such as an electric/electronic industry and an automobile industry.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2014-230098 filed on Nov. 12, 2014 including specification, claims, drawings and summary is incorporated herein by reference in its entirety.

What is claimed is:

1. An electric connector comprising:
a housing adapted to be fit into a mating electric connector; and
a cylindrical hollow terminal making contact with a projecting terminal arranged in said mating electric connector when said projecting terminal is inserted into said cylindrical hollow terminal,
said housing and said cylindrical hollow terminal being formed integrally with each other by an insertion-molding process,
said cylindrical hollow terminal being formed with a structure for preventing molten resin for said insertion-molding process from flowing into an area at which said cylindrical hollow terminal and said projecting terminal make contact with each other while said inserting-molding process is being carried out,
said structure being comprised of:
a projection projecting from an inner wall toward an inner space of said cylindrical hollow terminal; and
a bar-shaped die to be inserted into said cylindrical hollow terminal to engage at an outer surface thereof with said projection.

2. The electric connector as set forth in claim 1, wherein said projection is annular.

3. The electric connector as set forth in claim 1, wherein said cylindrical hollow terminal includes on an outer wall thereof a recess at the same location of said projection.

4. The electric connector as set forth in claim 1, wherein a plurality of said projections are formed in a length-wise direction of said cylindrical hollow terminal.

5. The electric connector as set forth in claim 1, wherein said cylindrical hollow terminal is formed at a circumferential wall thereof with at least one through-hole between a proximal end of said cylindrical hollow terminal and said projection.

6. The electric connector as set forth in claim 1, wherein said structure is comprised of a closed section comprising a closed proximal end of said cylindrical hollow terminal, said closed section having a thickness smaller than a diameter of said cylindrical hollow terminal and a width greater than a diameter of said cylindrical hollow terminal.

7. The electric connector as set forth in claim 6, wherein said closed section is formed by a pressing process.

8. The electric connector as set forth in claim 1, wherein said housing is comprised of an inner housing to be fit into a first space formed in an outer housing of said mating electric connector,
said inner housing being formed with a second space into which a first shaft arranged in said first space is fit, and a second shaft arranged in said second space and guided into a guide hole formed in said first shaft,
said cylindrical hollow terminal being formed as a part of said second shaft.

9. A method of fabricating an electric connector,
said electric connector comprising:
a housing adapted to be fit into a mating electric connector; and
a cylindrical hollow terminal making contact with a projecting terminal arranged in said mating electric connector when said projecting terminal is inserted into said cylindrical hollow terminal,
said housing and said cylindrical hollow terminal being formed integrally with each other by an insertion-molding process,
said cylindrical hollow terminal being formed with a structure for preventing molten resin for said insertion-molding process from flowing into an area at which said cylindrical hollow terminal and said projecting terminal make contact with each other while said inserting-molding process is being carried out,
said structure being comprised of:
a projection projecting from an inner wall toward an inner space of said cylindrical hollow terminal; and
a bar-shaped die to be inserted into said cylindrical hollow terminal to engage at an outer surface thereof with said projection, said method comprising:
inserting said bar-shaped die into said cylindrical hollow terminal to thereby cause said bar-shaped die to make contact with said projection; and
carrying out an insertion-molding process to form said housing and said cylindrical hollow terminal integrally with each other.

10. A method of fabricating an electric connector, comprising:
preparing a cylindrical hollow terminal making contact with a projecting terminal arranged in a mating electric connector when said projecting terminal is inserted into said cylindrical hollow terminal, and having a closed section comprising a closed proximal end opposite to a distal end into which said projecting terminal is inserted; and
carrying out an insertion-molding process to form a housing to be fit into said mating electric connector and said cylindrical hollow terminal integrally with each other.

* * * * *